(12) United States Patent
Beyne

(10) Patent No.: US 7,378,297 B2
(45) Date of Patent: May 27, 2008

(54) METHODS OF BONDING TWO SEMICONDUCTOR DEVICES

(75) Inventor: Eric Beyne, Leuven (BE)

(73) Assignee: Interuniversitair Microelektronica Centrum (IMEC) (BE)

( * ) Notice: Subject to any disclaimer, the term of this patent is extended or adjusted under 35 U.S.C. 154(b) by 0 days.

(21) Appl. No.: 11/441,794

(22) Filed: May 26, 2006

(65) Prior Publication Data
US 2007/0026568 A1 Feb. 1, 2007

Related U.S. Application Data

(63) Continuation-in-part of application No. 11/171,483, filed on Jun. 30, 2005, now Pat. No. 7,205,177.

(60) Provisional application No. 60/688,908, filed on Jun. 8, 2005, provisional application No. 60/617,761, filed on Oct. 12, 2004, provisional application No. 60/614,840, filed on Sep. 30, 2004.

(30) Foreign Application Priority Data

Jul. 1, 2004 (GB) .................................. 0414739.3
Jun. 8, 2005 (EP) .................................. 05447133

(51) Int. Cl.
H01L 21/00 (2006.01)
H01L 23/48 (2006.01)
H01L 31/02 (2006.01)

(52) U.S. Cl. ............ 438/108; 438/613; 257/738; 257/778; 228/180.21; 228/180.22

(58) Field of Classification Search ............ None
See application file for complete search history.

(56) References Cited

U.S. PATENT DOCUMENTS 5,641,113 A    6/1997    Somaki et al.

(Continued)

FOREIGN PATENT DOCUMENTS

EP    0 729 182 A2    8/1996

(Continued)

OTHER PUBLICATIONS

Keser et al., "Encapsulated Double-Bump WL-CSP: Design and Reliability," 2001 Electronic Components and Technology Conference.

(Continued)

Primary Examiner—Alonzo Chambliss
(74) Attorney, Agent, or Firm—Knobbe Martens Olson & Bear LLP

(57) ABSTRACT

A device and a method for bonding elements are described. A first solder ball is produced on a main surface of a first element. A second solder ball is produced on a main surface of a second element. Contact is provided between the first solder ball and the second solder ball. The first and second elements are bonded by applying a reflow act whereby the solder balls melt and form a joined solder ball structure. Prior to the bonding, the first solder ball is laterally embedded in a first layer of non-conductive material and the second solder ball is laterally embedded in a second layer of non-conductive material, such that the upper part of the first solder ball and upper part of the second solder ball are not covered by the non-conductive material. A third solder volume is applied on one or both of the embedded first or second solder balls, prior to the bonding.

22 Claims, 17 Drawing Sheets

U.S. PATENT DOCUMENTS

| | | |
|---|---|---|
| 5,844,315 A | 12/1998 | Melton et al. |
| 6,168,972 B1 | 1/2001 | Wang et al. |
| 6,229,158 B1 | 5/2001 | Minemier et al. |
| 6,425,516 B1 | 7/2002 | Iwatsu et al. |
| 6,555,917 B1 | 4/2003 | Heo |
| 6,664,637 B2 | 12/2003 | Jimarez et al. |
| 6,787,917 B2 | 9/2004 | Lee et al. |
| 6,908,784 B1 | 6/2005 | Farnworth et al. |
| 7,122,906 B2 | 10/2006 | Doan |
| 7,205,177 B2 * | 4/2007 | De Raedt et al. ........... 438/108 |
| 2002/0195703 A1 | 12/2002 | Kameda |
| 2005/0017336 A1 | 1/2005 | Kung et al. |

FOREIGN PATENT DOCUMENTS

| | | |
|---|---|---|
| EP | 0 875 935 A2 | 11/1998 |
| EP | 1 489 657 A1 | 12/2004 |
| JP | 2004265888 | 9/2004 |
| WO | WO 99/04430 | 1/1999 |

OTHER PUBLICATIONS

Beyne, "3D Interconnection and Packaging: 3D-SIP, 3D-SOC or 3D-IC?," IMEC, Belgium.

* cited by examiner

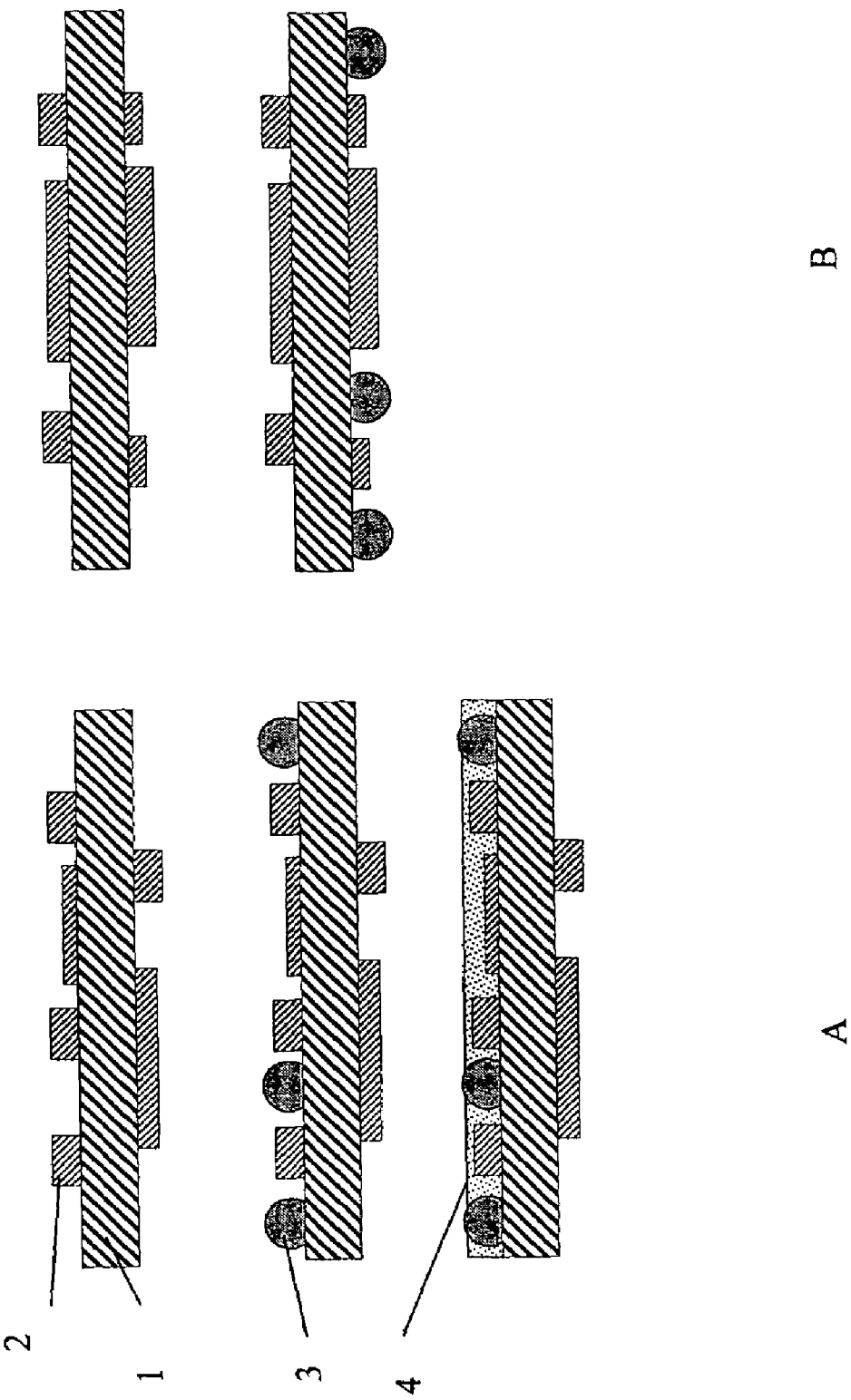

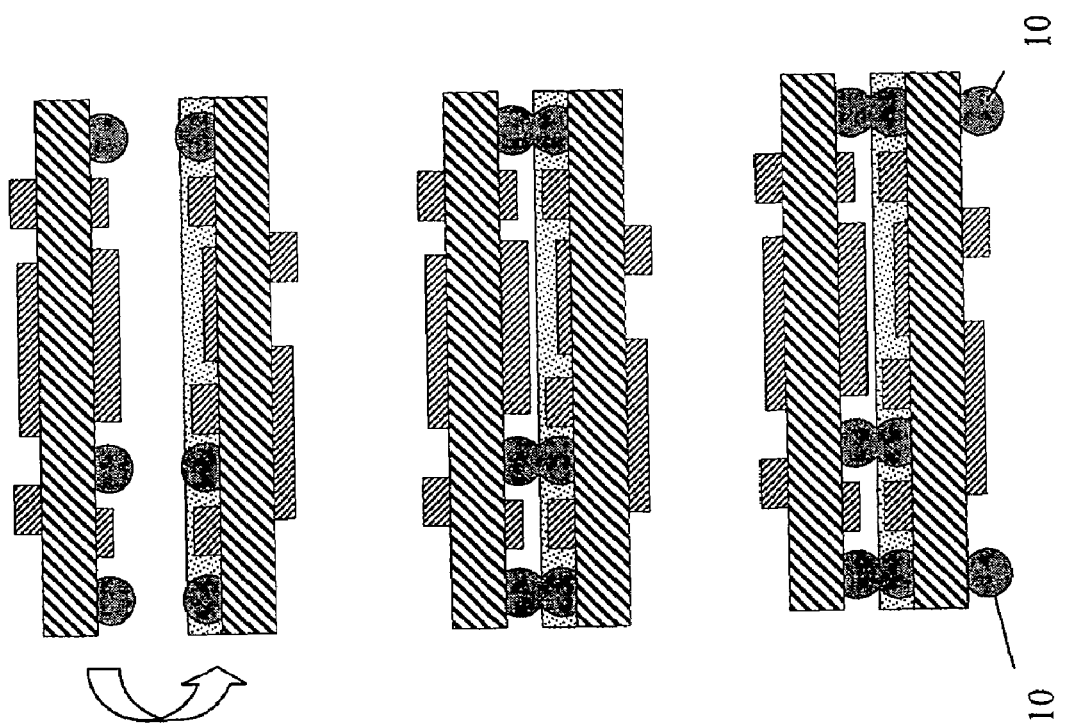

METHODS OF BONDING TWO SEMICONDUCTOR DEVICES

CROSS-REFERENCE TO RELATED APPLICATIONS

This application is a continuation-in-part of U.S. patent application Ser. No. 11/171,483, filed Jun. 30, 2005 now U.S. Pat. No. 7,205,177. This application claims the benefit under 35 U.S.C. § 119(a) of European Patent Application No. EP 05447133.9, filed Jun. 8, 2005, all of which are hereby incorporated by reference. U.S. patent application Ser. No. 11/171,483 claims the benefit under 35 U.S.C. § 119(e) of U.S. Patent Application Nos. 60/614,840 filed Sep. 30, 2004, for INTEGRATED ANTENNA FOR WIRELESS RF DEVICES, 60/617,761 filed Oct. 12, 2004, for "WIRELESS COMMUNICATION AND HEALTH MONITORING SYSTEM", and 60/688,908 filed Jun. 8, 2005, for "METHODS FOR BONDING AND DEVICES ACCORDING TO SUCH METHODS", and claims the benefit under 35 U.S.C. § 119(a) of British patent application GB 0414739.3 filed on Jul. 1, 2004, all of which are hereby incorporated by reference.

FIELD OF THE INVENTION

The present invention is related to the field of microelectronics, in particular to methods for bonding two elements, as for instance the bonding of two wafers, wafer and dies or dies and dies, particularly in the field of 3D-SiP (three-dimensional System in a Package) technologies.

DESCRIPTION OF THE RELATED ART

In the field of 3D stacking of system-in-a-Package (SiP) devices, packages are used with solder ball connections (BGA; Ball Grid Array) and CSP (Chip Scale Package)-style connections. Also in other fields solder balls can be used to provide bonding between two elements.

In order to realize a dense 3D interconnection between such devices, small diameter solder-balls are required. However, the diameter has to be larger than the height of the components, which are typically present on the individual SiP layers or elements. Solder balls are joined when they are in the liquid state. At making contact, they collapse and are joined in the form of a larger solder ball, which forms the final bonding structure between the two elements which are bonded together. The diameter of the final solder ball is larger than the diameter of the initial solder balls, and smaller than the sum of the diameters of the initial solder balls. In other words, the formation of the bonding structure requires an amount of space around the initial solder balls, on which no components or structures can be placed, otherwise these structures would be engulfed by the final solder ball after joining. Also, the final distance between bonded surfaces is determined by the diameter of the joint solder structure, and not by the sum of the diameters of the initial solder balls. This is why it is sometimes necessary to provide relatively large solder balls, when components of a large height are present on the elements to be bonded. This further decreases the space available on the surfaces to be bonded.

Document EP0875935 discloses a semiconductor device comprising solder bumps which are covered by a masking film, and surrounded at their base by a reinforcement film. The reinforcement film has a sloping cross section, and is aimed at reinforcing the bumps against shear forces caused by heat generated during operation of the semiconductor device.

Document EP729182 discloses the application of a resin layer between an external connecting electrode of a chip carrier, in the form of a solder ball, and a circuit wiring board. The aim of the resin layer is again related to a reduction of the risk of cracking due to a difference in thermal expansion coefficients.

SUMMARY OF CERTAIN EMBODIMENTS

A method and corresponding devices are provided for bonding two elements, as for instance the bonding of two SiP layers which can be part of a 3D-stack or multilayer stack.

According to embodiments of the method and device, the solder balls of a first substrate are encapsulated in a polymer resin (e.g., glob-top epoxy or packaging plastic molding compound) and only exposed at the top surface. The solder ball of the second substrate can then be mounted on the first ball, without the risk of collapse of the solder column or shorting between neighboring solder connections. A first element (e.g., a substrate) is provided with one or more solder balls on its main surface, and a second element (e.g., a chip or die) is equally provided with one or more solder balls on its main surface, and where the elements are bonded via contacting two solder balls of the respective elements, to form a solder structure, through a reflow step or act of the solder balls.

The method comprises providing, prior to bonding, a layer of non-conductive material on the main surface of at least one of the elements. This layer of non-conductive material (e.g., an epoxy resin) is essentially parallel to the main surface to which it is applied, and its height is preferably at least 50% of the height of the embedded solder ball. According to further preferred embodiments, the height of the layer is at least 60%, or at least 70%, or at least 80%, or at least 90% of the solder ball height, but lower than 100%. According to the preferred embodiment, the layer of non-conductive material is applied so that it does not cover the solder balls completely. According to another embodiment, the layer of non-conductive material is applied on a main surface, to cover the solder balls on the surface completely, after which back-grinding is applied, to reduce the thickness of the polymer layer and expose the top surface of the solder balls (a segment of the top of the solder ball will be removed, leaving an approximately flat, typically circular solder area). Also in the latter embodiment, after the back-grinding, the non-conductive layer does not cover the upper part of the solder ball. Also in the embodiment involving back-grinding, the height of the layer of non-conductive material is preferably at least 50% and less than 100% of the height of the original solder ball.

According to one embodiment, both the first and second solder ball are embedded in a layer of non-conductive material, and the contact is made by applying a third solder volume, as for instance but not only, a third solder ball, or a third and a fourth solder ball, between the first and second solder balls or solder volumes. This third solder volume may be applied to only one or both layers comprising at least partially embedded solder balls.

A part of the solder volume can thus be applied on one layer comprising at least partially embedded solder balls, while the remaining solder volume can be applied on the other layer comprising at least partially embedded solder balls.

Different methods may be used to apply the third solder volume, such as e.g., the placement of preform solder balls, screen printing or solder jetting. The volume of the third solder volume may be optimized to achieve an appropriate solder thickness.

As a result of the embedding layer around one or both the solder balls which are to be joined, the collapse of these solder balls into a large joined solder ball is avoided. Instead, the final joint structure is a stack of the two original solder balls (preferably, the structure has an 'eight' shape), with a lateral width which is approximately equal to the diameter of the original solder balls, and a height approximately equal to the sum of the diameters of the original solder balls. This makes it possible to use more of the surface of the elements to be bonded, and to increase the distance between the bonded surfaces, after joining, so that larger (higher) components or structures may be present on the surfaces. When a third solder ball or solder volume is applied, the resulting solder structure can be a stack of three balls of approximately equal diameter. It can also be a stack of an upper solder ball, a lower solder ball, and a middle solder volume, as for instance, a third or middle solder ball. The middle or third solder ball does not need to have the same dimensions as the first and the second solder balls. The dimensions of the first and second solder balls do not necessarily have to be the same. Preferably the solder material of the first solder ball, of the second solder ball and of the third solder volume is the same.

SiP packages are packages comprising an interconnect substrate 1 and devices 2 mounted on the surface of the substrate (see FIG. 1). The thus packaged circuit can realize a system or subsystem functionality. Components can be mounted on both sides of the Chip Scale Package (CSP) substrates. These components can be wire-bonded or flip-chip mounted IC's, standard SMT (Standard Mount Technology) passives or other components such as clock reference crystals, but also other devices. These components can typically be characterized by having a height above the substrate different from zero and up to several hundreds of micrometers.

The solder balls can have a diameter between 100 microns and 1 mm. They can for instance have a diameter of 200, 300, 400, 500, 600, 700, 800, 900 microns. Also smaller or larger solder balls are possible.

According to certain embodiments, the layer of non-conductive material is present on an element which comprises components or structures on its main surface. In that case, the non-conductive layer may cover the components or structures completely, namely, the thickness of the non-conductive material layer is larger than the maximum thickness of the components or structures.

According to one embodiment, at least one of the non-conductive layers is provided with an exclusion area, which is an area where no non-conductive material is present or where the thickness of the non-conductive material is lower than on the remainder of the main surface on which the non-conductive material is applied. Advantageously, in that case, one of the elements comprises on its main surface a component or structure which is higher than the solder balls on the surface, and which is positioned facing an exclusion area on the opposite element when the elements are bonded together. In this way, due to the exclusion area and the fact that the component in question is less high than the solder structure, the component does not touch the opposing element when the elements are bonded together.

According to an embodiment, the exclusion area further comprises a confinement structure, providing an enclosure to the exclusion area.

The method may comprise applying an underfill/overmold material, to fill the gaps between the elements, after the bonding step.

The method may be applied an integer number of times, to obtain a stack of more than two elements, starting by bonding a third element to a main surface of the device obtained by the acts described above. Further elements may be bonded to the device obtained from that further act and so on. In the case of a device comprising more than two elements, bonded together according to the method, the underfill/overmold act may be performed after every bonding act, or one underfill/overmold act may be performed for the whole package, after the conclusion of all the consecutive bonding acts. Also according to an embodiment, a reflow step or act may be performed at each bonding process between two elements, or the same reflow step can be applied for bonding all elements in a stack. Another possibility is to apply the method of the invention to bond together M elements with M>2, by N reflow steps, with N<M−1.

A device can be produced according to the method. The device is characterized in that it comprises a first and second element, bonded together by one or more bonding structures, each structure having been obtained by bonding a first solder ball present on a main surface of the first element, to a solder ball present on a main surface of the second element, and thereby essentially comprising a stack of two solder balls. In the preferred embodiment, the bonding structure has an 8-shape. At least one of the elements of the device is further provided with a layer of non-conductive material, on the main surface of the element, and embedding the solder ball(s) present on the main surface. The layer is parallel to the main surface to which it is applied. At least one of the elements which are part of the device may comprise one or more components or structures on its main surface, and extending outward from the surface. In one embodiment, both of the solder balls are embedded in a layer of non-conductive material, and the bonding structure comprises a solder structure which essentially forms a stack of a lower solder ball, an upper solder ball and a middle solder volume (as for instance, a third solder ball), which forms a single structure.

According to one embodiment, in a device, at least one of the non-conductive layers is provided with an exclusion area, which is an area where no non-conductive material is present or where the thickness of the non-conductive material is lower than on the remainder of the main surface on which the non-conductive material is applied. Advantageously, in that case, one of the elements comprises on its main surface a component or structure which is higher than the solder balls on the surface, and which is positioned facing an exclusion area on the opposite element when the elements are bonded together. In this way, due to the exclusion area and the fact that the component in question is less high than the solder structure, the component does not touch the opposing element when the elements are bonded together.

According to an embodiment of the device, the exclusion area further comprises a confinement structure, providing an enclosure to the exclusion area.

In a device, the bonding structure may further comprise a layer of underfill/overmold material in between the main surfaces of the elements. The layer of underfill/overmold material may be located between a main surface of one element and an embedding layer or between two embedding layers.

In one embodiment, there is a method for bonding elements, the method comprising producing on a main surface of a first element a first solder ball; producing on a main surface of a second element a second solder ball; providing contact between the first solder ball and the second solder ball; bonding the first element and the second element by applying a reflow act whereby the solder balls melt and form a joined solder ball structure; wherein prior to the bonding, the first solder ball is laterally embedded in a first layer of non-conductive material, such that the upper part of the first solder ball is not covered by the non-conductive material; and prior to the bonding, the second solder ball is laterally embedded in a second layer of non-conductive material, such that the upper part of the second solder ball is not covered by the non-conductive material, further comprising applying a third solder volume on one or both of the embedded first or second solder balls, prior to the bonding.

In another embodiment, there is a device comprising at least two elements, the elements being bonded by a bonding structure located between a main surface of a first element and a main surface of a second element, wherein the bonding structure comprises a solder structure which essentially forms a stack of a lower solder ball, an upper solder ball and a middle or third solder volume, and which form a single structure.

BRIEF DESCRIPTION OF THE FIGURES

The FIGS. 1-9 represent methods and devices according to certain embodiments. In FIG. 1 to FIG. 4, embodiments wherein two elements are bonded are illustrated.

FIG. 1 is a diagram showing preparation of the SiP substrate (case of two substrates).

FIG. 2 is a diagram showing a principle of the SiP substrate stacking (case of two substrates).

FIG. 4 is a diagram showing a principle of the SiP substrate stacking: including bottom-side molding (case of two substrates).

In FIG. 5 and FIG. 6, embodiments where three or more elements or substrates are bonded are illustrated.

FIG. 5 is a diagram showing preparation of the SiP substrate (case of three or more substrates).

FIG. 7 is a diagram showing alternative preparation of the SiP substrate (case of two substrates).

FIG. 8 is a diagram showing a principle of the SiP substrate stacking (alternative case of two substrates).

FIG. 9 is a diagram showing a principle of the SiP substrate stacking: using wafer or substrate-level base wafer (case of three or more substrates, alternative).

DETAILED DESCRIPTION OF CERTAIN EMBODIMENTS

Figure 3A:
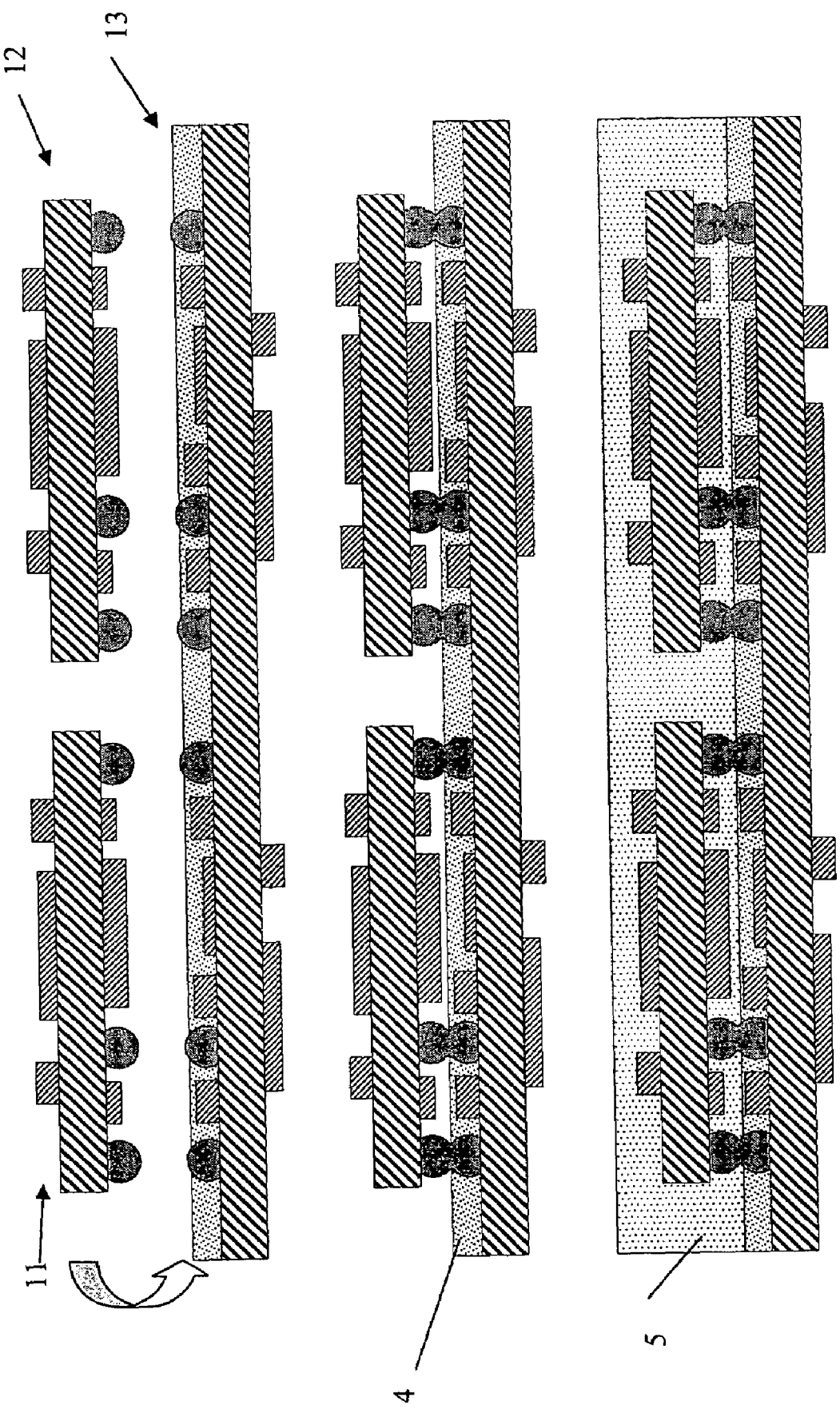
FIG. 3a is a diagram showing a principle of the SiP substrate stacking: using wafer or substrate as a basis (case of two substrates).

The present invention will be described with respect to particular embodiments and with reference to certain drawings. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes. It is to be understood that the terms so used are interchangeable under appropriate circumstances and that the embodiments described herein are capable of operation in other orientations than described or illustrated herein. The same reference signs in different figures refer to similar elements.

In one embodiment, a method for bonding is disclosed comprising
producing on a first main surface of a first element a first solder ball,
producing on a first main surface of a second element a second solder ball,
providing contact between the first solder ball and the second solder ball,
bonding the first element and the second element by applying a reflow act
whereby the solder balls melt and form a joined solder ball structure where, prior to the bonding, the first solder ball is laterally embedded in a non-conductive material (therefore called embedding layer), such that the upper part of the first solder ball is not covered by the non-conductive material.

In certain embodiments, a step of applying an underfill/overmold material after the bonding between the first main surface of the second element and the first main surface of the first element can be applied.

Also the second solder ball can be laterally embedded in a non-conductive material, such that the upper part of the second solder ball is not covered by the non-conductive material. This non-conductive material is preferably laterally embedding (therefore called embedding layer) the second solder ball up to an embedding level parallel to the first main surface and which does not extend above the second solder ball.

In advantageous embodiments, the first main surface of the first element and/or the first main surface of the second element comprise components or structures, whereby the first and the second solder balls are such that the height of the components and/or structures is smaller then the height of the first solder ball and/or the second solder ball respectively. In such embodiments, the height of the embedding layer(s) is preferably higher than the height of the components (and of course lower then the respective solder ball height).

In certain embodiments, the first main surface of the first element and/or the first main surface of the second element comprise components or structures which have a topology that extends outwards from the respective main surfaces, and whereby the first and the second solder balls are such that the height of at least one of the components and/or structures on the first main surface of the first element and/or the first main surface of the second element is smaller then the height of the joined solder ball structure, but higher than the solder balls on the corresponding main surface. These embodiments can be achieved by providing preformed embedding layers which for instance include exclusion areas (see e.g., FIG. 11, FIG. 13a, b and FIG. 14), or recesses (see e.g., FIG. 12), namely, areas in which no or only a thinner layer of non conductive material is present, respectively. Such embedding layers which comprise exclusion areas or recesses can be produced by transfer molding or injection molding techniques. Also a glob-top technique whereby a liquid encapsulant is applied can be used. The presence of additional confinement structures 6 (e.g., see FIG. 13), which provide enclosures corresponding to exclusion areas, may be necessary, such that no non-conductive solder ball embedding material can enter the exclusion area. Such confinement structures are not always necessary; molding techniques can also be used which provide exclusion areas. In embodiments whereby exclusion areas are provided on both main surfaces (or similar whereby an embedding layer is only present on one main surface only and comprises an exclusion area), which moreover overlap, and in which on both main surfaces in the respective exclusion area, components are provided, special care should further be taken in the positioning of the components on the first main surfaces, such that components present on the first main surface of a first element are not blocked by components mounted on the first main surface of the second element when both elements are to be bound. This can be achieved by combining lower height components on a first main surface of a first element, with higher height components on a main surface of a second element (e.g., see FIG. 14), or by misaligning the components on the first and second main surfaces on the first and second elements respectively (see FIG. 11). The combined height of the two components should though be smaller then the joined solder ball structure. It should further be understood that lower and higher components in an exclusion area on a first main surface of a first element can be combined with higher and lower components respectively in an exclusion area on a second main surface of a second element. Such embodiments are shown in FIG. 14.

In preferred embodiments, a step of applying an underfill/overmold operation, which fills up the remaining gaps between the elements can be applied.

The embodiments of the methods can of course be used repetitively for stacking more then two or three elements.

A method for producing stacked structures is disclosed, wherein methods according to one of the earlier described embodiments is applied an integer number of times, by repetitively bonding a main surface of an element, bonded before by the present method, to a main surface of a further element.

In an embodiment where more then two elements are stacked, the step of applying an underfill/overmold operation can advantageously be applied only once for the whole stacked structure, although this is not strictly necessary.

The elements referred to can be any element known to be usable to a person of ordinary skill in the art, but can for instance be substrates, wafers, chips or dies.

In a second aspect, devices are disclosed corresponding to the first aspect, comprising at least two elements, the elements being bonded by a bonding structure located between a first main surface of a first element and a first main surface of a second element, where the bonding structure comprises a solder structure which is essentially a stack of a lower and an upper solder ball, which form a single structure.

In certain embodiments, the solder structure is essentially 8-shaped; which means that any cross-section of the structure along the longitudinal axis provides an "8" form, the form of the number "eight". Each of the two loops of this 8-shape then corresponds to a solder ball. The "8" form can be such that the upper loop is larger then the lower loop, or such that the lower loop is larger then the upper loop; the first and second solder balls do not necessarily need to be of the same dimensions. Preferably the solder material of the first solder ball and the second solder ball is the same.

In certain embodiments, the lower or/and the upper solder ball(s) is/are laterally embedded in a non-conductive material up to an embedding level which is lower then the height of the top surface of the respective solder balls.

In certain embodiments, the first main surface of at least one of the elements comprises at least one component which extends outwards from the first main surface of the corresponding element, and the respective embedding levels are further such that the component(s) are completely covered by the non-conductive material.

The bonding structure can further comprise a layer of underfill/overmold material in between the first main surfaces of the elements.

A device is disclosed, where the layer of underfill/overmold material is located between a first main surface of one element and an embedding layer on a first main surface of a second element or between the two embedding layers of the two first main surfaces of the two elements respectively.

DESCRIPTION OF PREFERRED EMBODIMENTS

In FIG. 1, the preparation SiP devices for 3D stacking is illustrated, according to certain embodiments. Sequence A is directed to a bottom substrate and sequence B to a top substrate.

Figure 10:
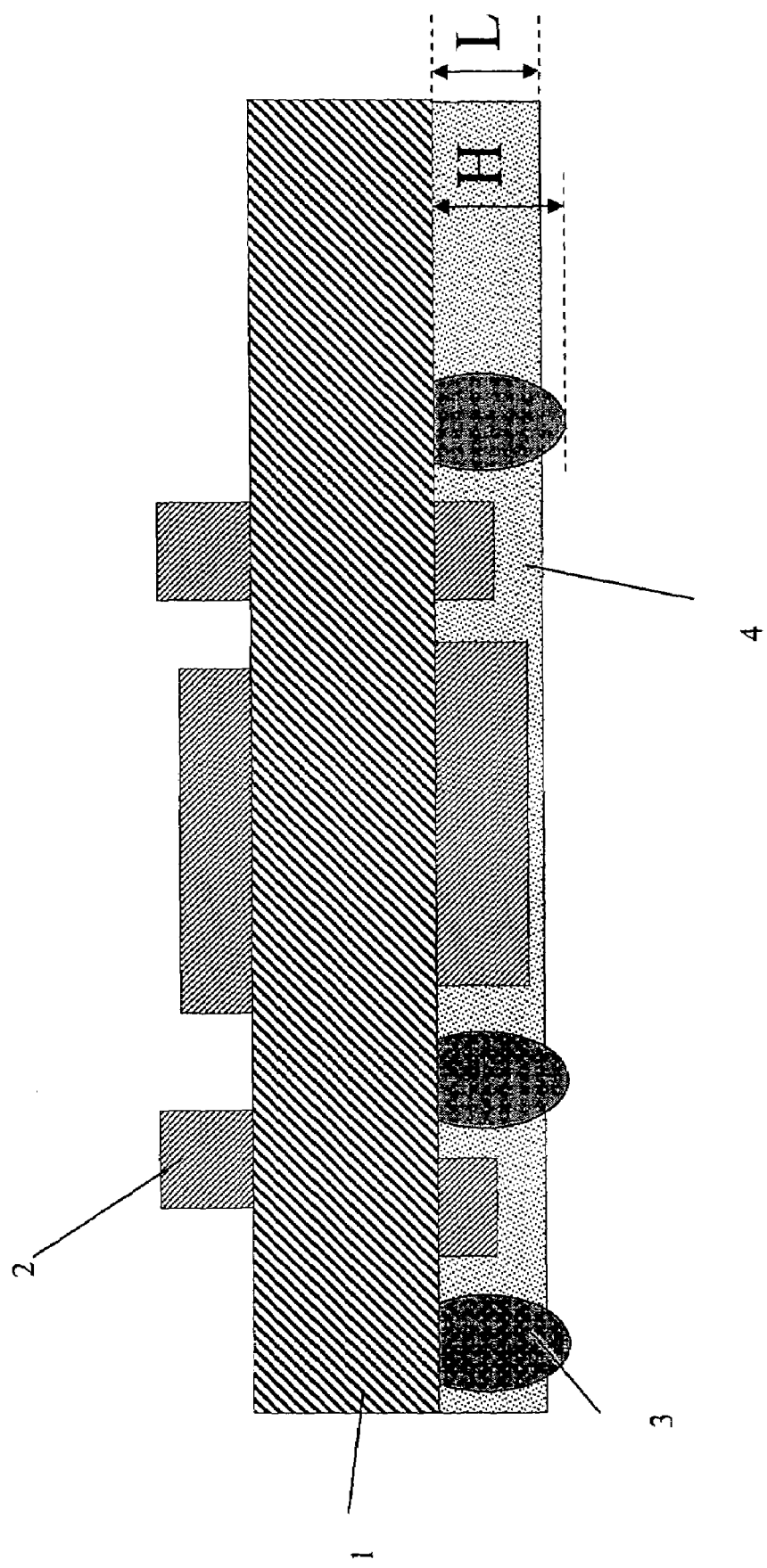
FIG. 10 is a diagram showing a generic representation of a solder ball or structure on a first main surface of an element and where the height parameter is indicated.

Components 2 are mounted on the elements 1, e.g., substrates or wafers. The component can be any type of surface mount component known to a person of ordinary skill in the art. Such component typically extends outwards of a main surface of the element e.g., substrate. In FIG. 10, the parameters "H"; height and "L"; level are illustrated generically.

Next, solder balls 3 are attached to the top of the bottom substrate and the bottom of the top substrate, using standard BGA and CSP solder ball mounting techniques. In preferred embodiments, pre-form solder balls are used, placed on the substrate by a collective technique (e.g., stencil printing) and attached to the substrates by reflow soldering.

The attachment may actually be performed simultaneously with the deposition of some of the surface mount components 2 in the prior step. In other embodiments, the solder balls can be individually picked and placed with a fine pitch SMT (surface mount technology) placement machine.

In a next step, the solder balls and surface mounted components on the bottom wafer are encapsulated with a polymer layer 4. The solder balls should however not be completely covered by this layer.

Possible methods are the dispensing of a liquid epoxy 'glob-top' or 'under-fill' type compound that automatically levels and fills all gaps between and below components. Also transfer molding of plastic encapsulation material can be used.

In case the solder balls are covered by a layer thicker than the solder balls, a back grinding step can be used to reduce the thickness of the polymer layer and expose the top surface of the solder balls (a segment of the top of the solder ball will be removed, leaving a approximately flat, typically circular solder area).

In FIG. 2, the principle of stacking of two SiP devices according to certain embodiments is illustrated.

The top substrate SiP is mounted to the base substrate and attached using solder reflow. The distance between the substrates is maintained as the bottom solder ball is not able to collapse during soldering. From a certain viewpoint, the bottom solder balls act as regular contact pads for the top SiP solder balls.

After reflow, solder balls 10 can be applied to the second main surface of the bottom substrate to finalize the 3D-SiP assembly. In other embodiments, the solder balls 10 on the second main surface of the bottom substrate can be already present before the reflow step.

Figure 3B:
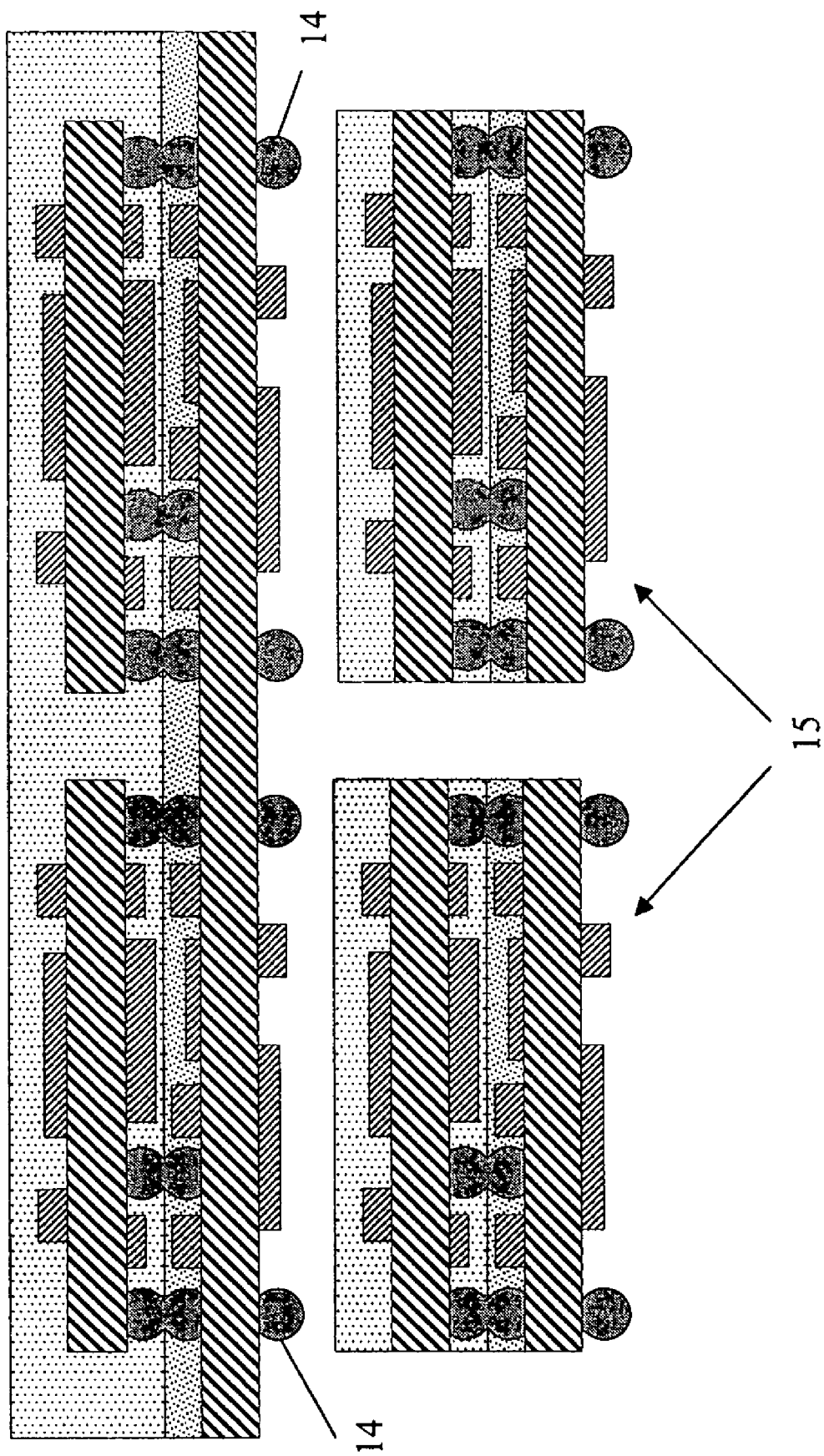
FIG. 3b is a diagram showing a principle of the SiP substrate stacking: using wafer or substrate as a basis (case of two substrates).

This step of FIG. 2 may be performed with large substrates with arrays of SiP devices or with singulated and tested SiP substrates, or with singulated and tested SiP devices mounted on tested SiP substrates as shown in FIG. 3a and FIG. 3b. Such testing performed on the devices and substrates can be testing the functioning, the performance, the reliability, etc. of the devices and substrates, respectively.

In FIG. 3, certain embodiments are illustrated, where two tested SiP devices 11, 12 are stacked on a SiP substrate 13.

This flow is similar to the one of FIG. 2, but here tested known-good SiP are placed on tested known-good SiP sides of the bottom wafer (where 'known-good' is meant to be "tested with a positive result", and thus properly usable). Defective sites on the bottom substrate can be and are preferably left empty.

Figure 6A:
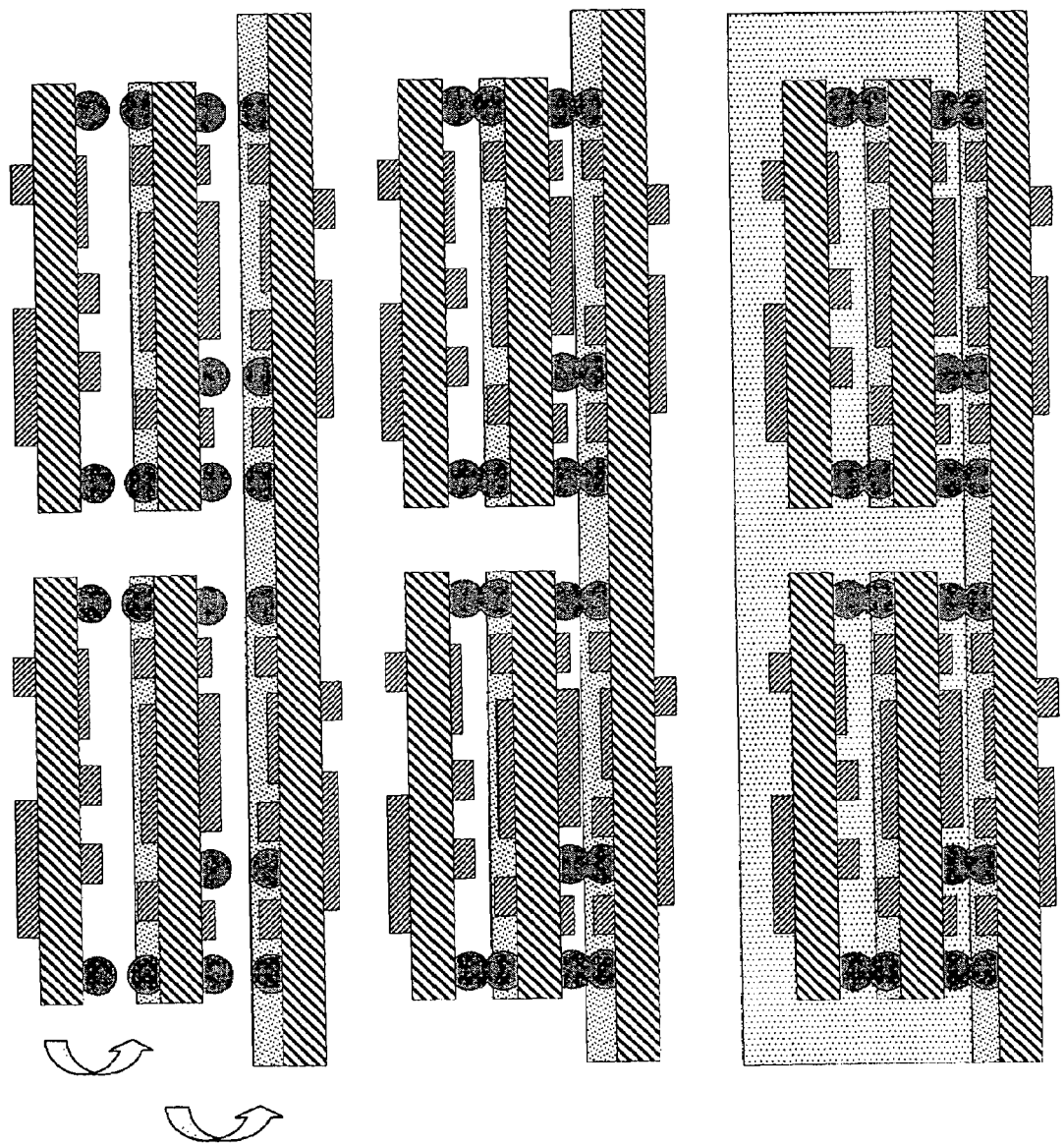
FIGS. 6a and 6b are diagrams showing a principle of the SiP substrate stacking: using wafer or substrate as a basis (case of three or more substrates).
Figure 6B:
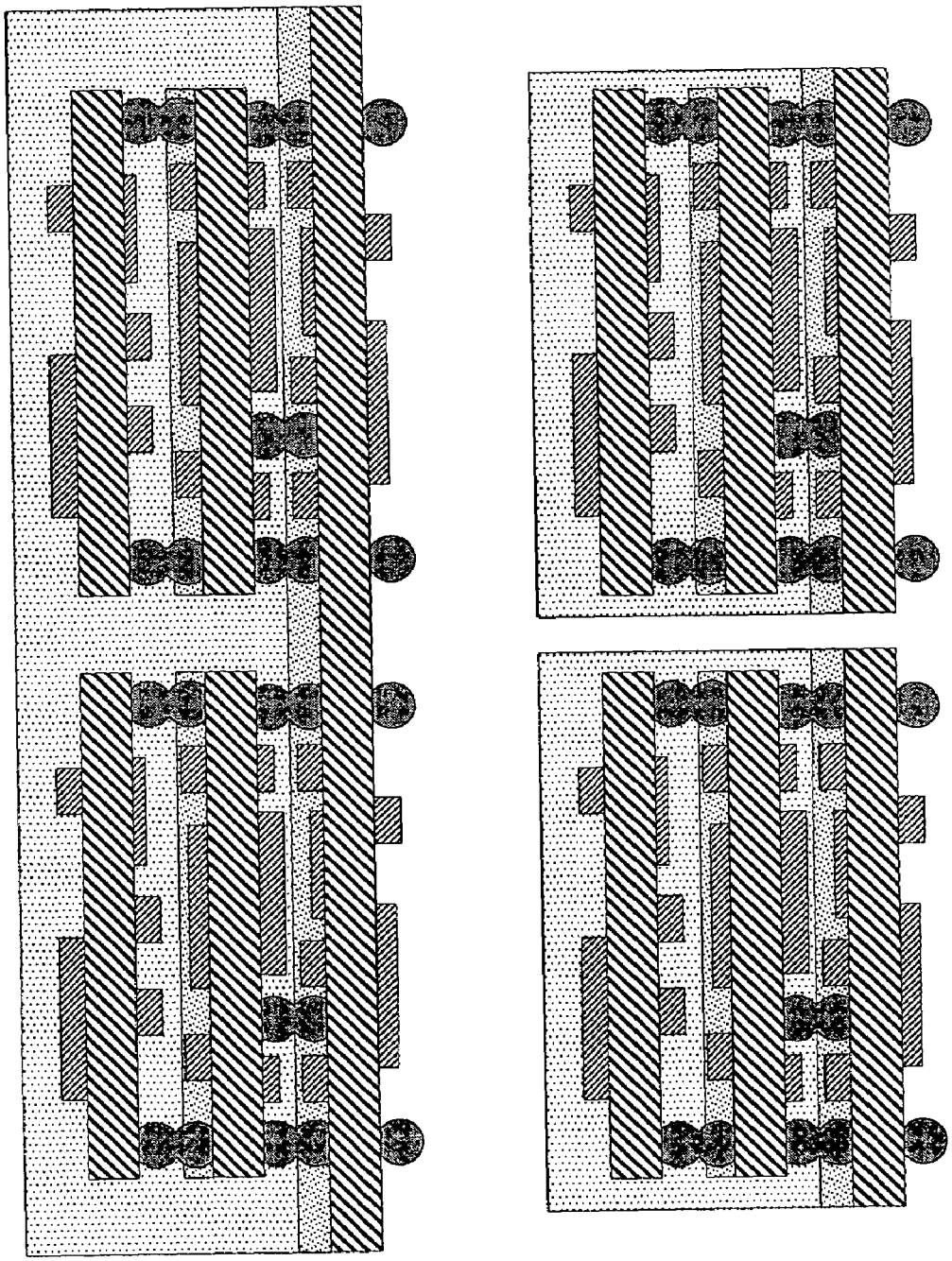

In addition, after mounting the devices, an underfill/overmold operation can be performed, encapsulating all structures by a layer 5, see FIG. 3a and FIG. 6. Standard transfer molding is a preferred option for this process, but also possible is the use of liquid epoxy encapsulants as used for 'glob-top' or 'under-fill' applications, as well as suitable options known to a person of ordinary skill.

Solder balls 14 can be applied to the second main surface of the bottom substrate after this molding step (FIG. 3b), or before. After this step, dicing the substrate to obtain fully encapsulated 3D-SiP devices 15 can be performed.

Figure 4:
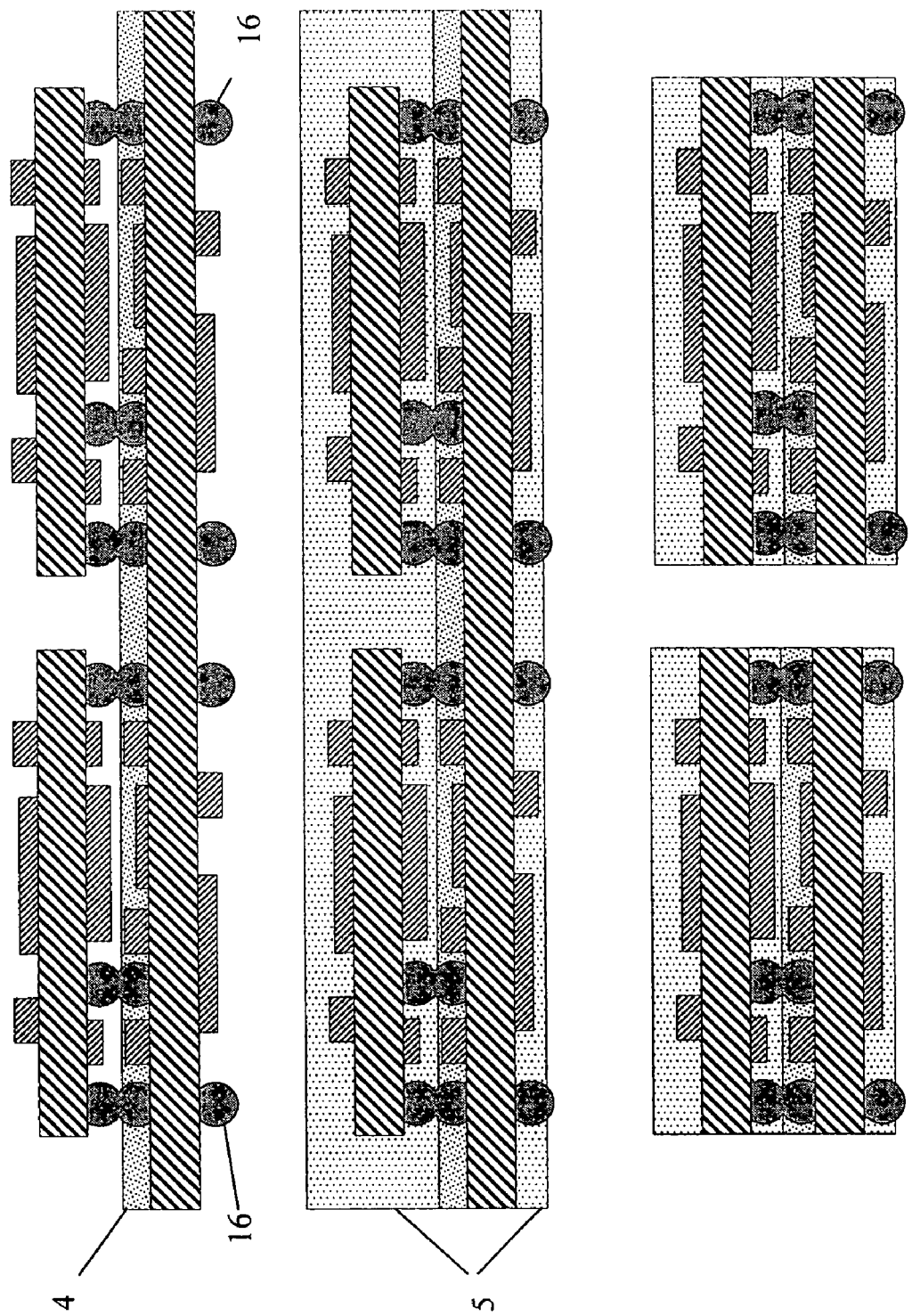

In FIG. 4, certain further embodiments are illustrated. Here, solder balls 16 are provided to the second main surface of the bottom substrate before the molding step. Molding is then performed on both sides of the substrate (see layers 5 in FIG. 4), however, leaving the tips of the bottom solder balls partially free. This module can be used as a land-grid array type package, or a second solder ball can be applied on the bottom for improved thermo-mechanical reliability after assembly to a motherboard.

Figure 5:
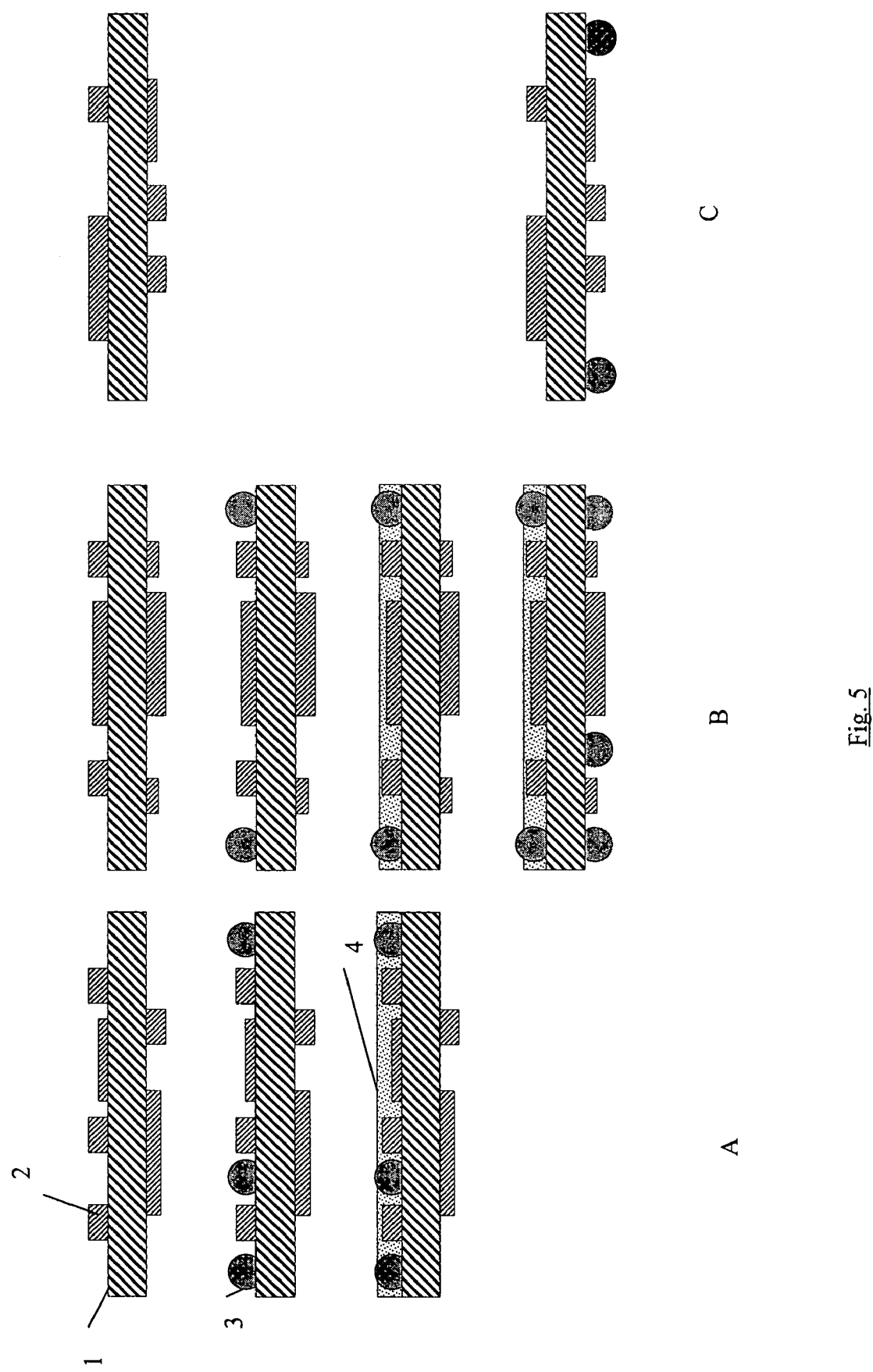

In FIGS. 5 and 6 other embodiments are depicted. The preparation and stacking of SiP devices for 3D stacking in the case of three or more samples is shown.

These embodiments are similar to those of FIG. 1 to FIG. 4, regarding the preparation of the bottom (sequence A) and top (sequence C) substrates. However, the substrate or substrates in the middle (sequence B) receive solder balls on both sides.

In certain embodiments, a reflow step or act can be applied at each bonding process between two elements. In other embodiments, the same solder reflow step can be applied for bonding all elements in a stack. In certain embodiments, N reflow steps are performed for bonding M elements, with N<M−1, for M>2.

Figure 7:
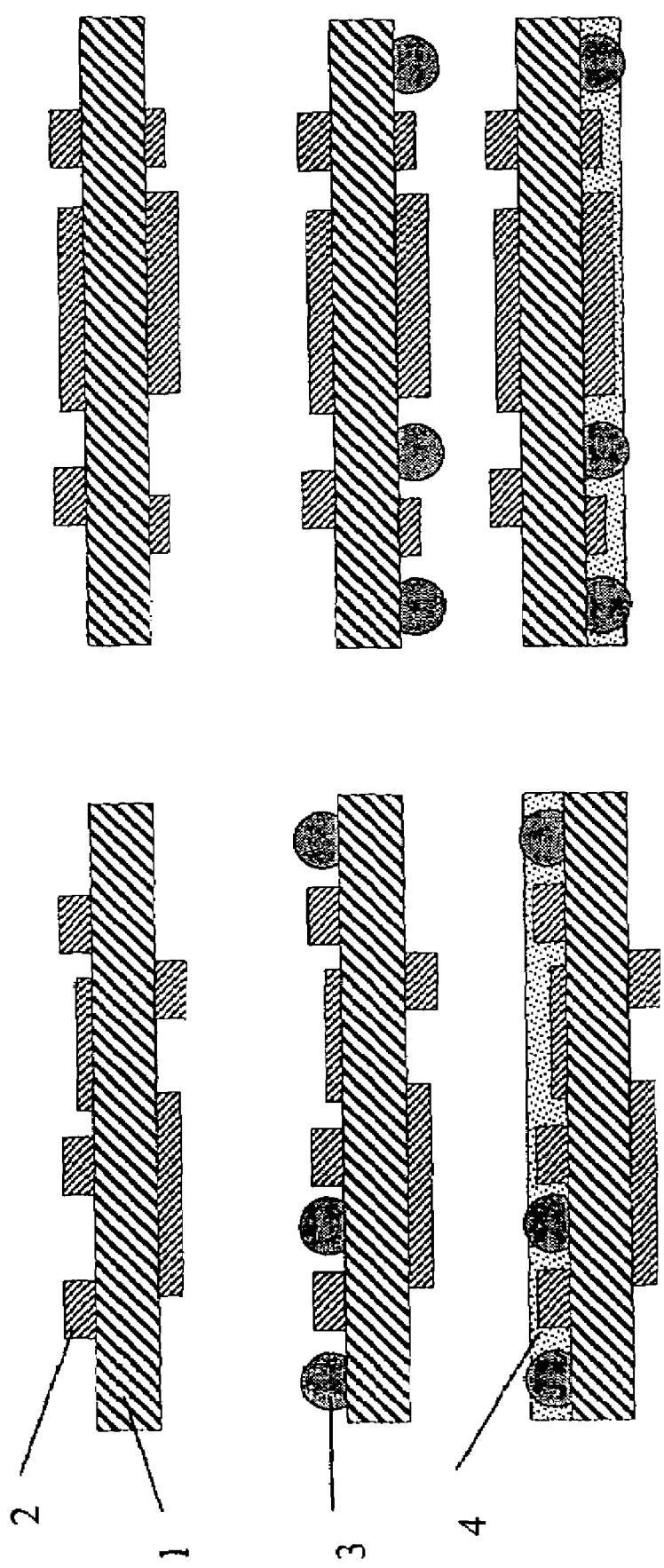
In FIG. 7 to FIG. 9, further embodiments are illustrated, which are similar to the embodiments of FIG. 1 to FIG. 6, but where both solder balls which are to be joined are both partially embedded in a non-conductive material as described in detail in the description.
Figure 8:
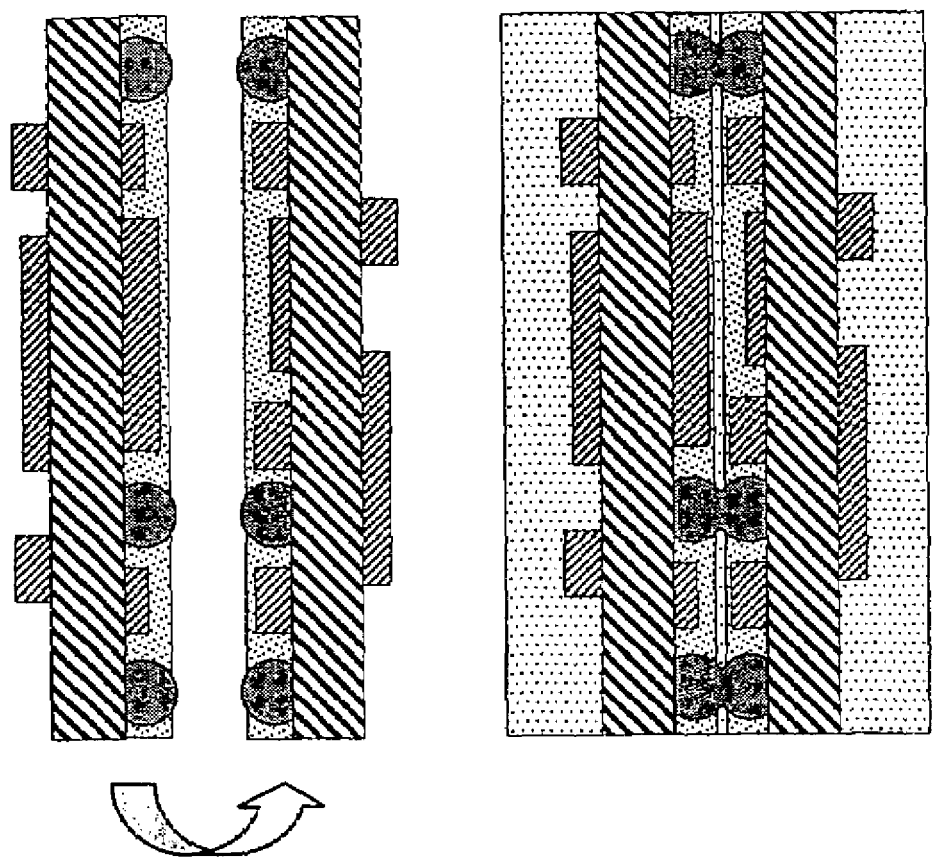
Figure 9:
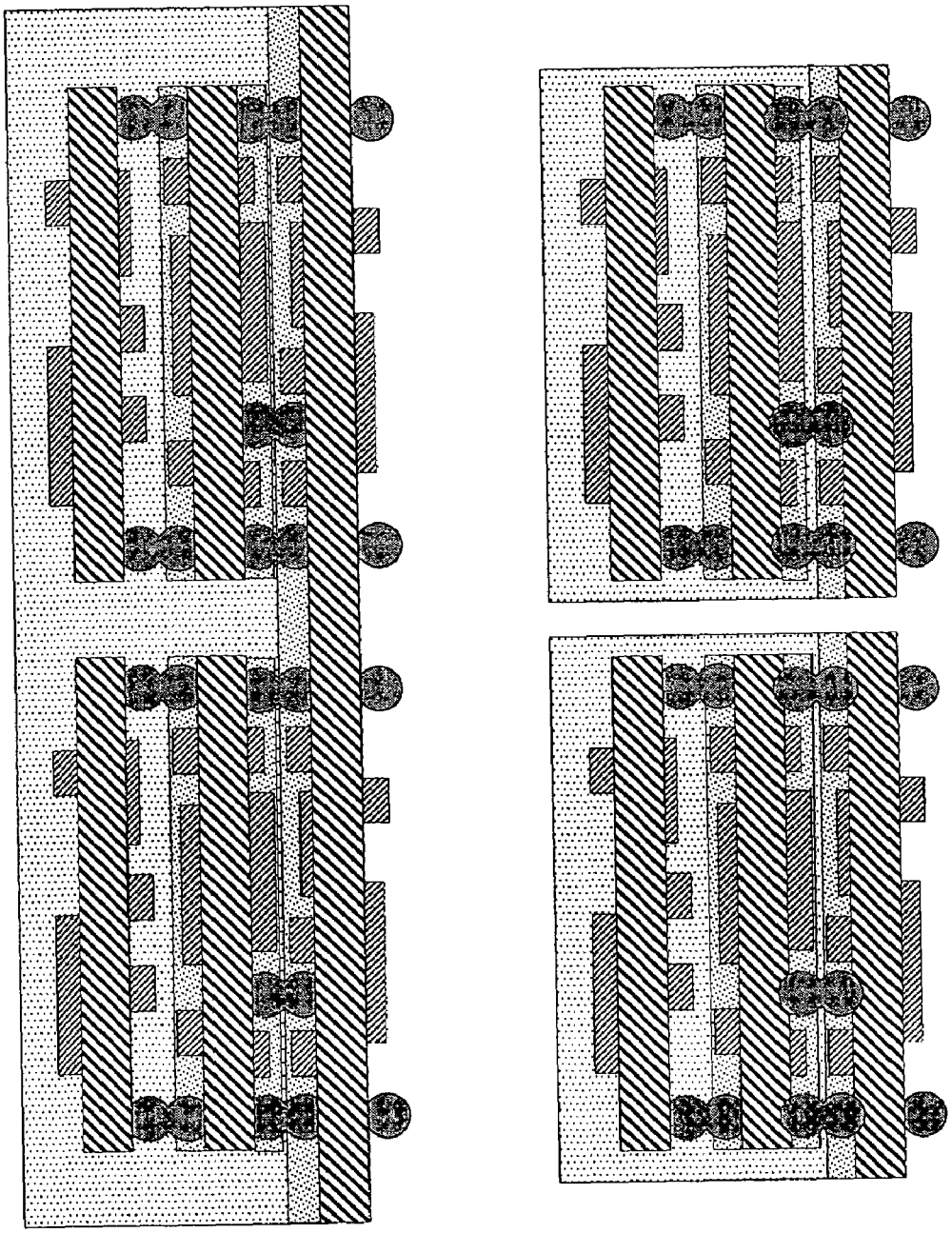

In FIG. 7 to FIG. 9, certain further embodiments are illustrated, which are similar to the embodiments of FIG. 1 to FIG. 6, but where both solder balls respectively attached to a first main surface of a first element and a first main surface of a second element are both embedded laterally up to respectively level L and L', which are below the respective levels H and H' of the top surface of the respective solder balls. (see FIG. 10 where a generic representation is given of a solder ball or structure on a first main surface of an element and the height parameters L and H are indicated).

Such structures can be used in the bonding of two, three, or more SiP levels. For each couple of to-be-joined solder balls, at least one, but also both solder balls can be embedded laterally by a non-conductive material. This choice depends on the requirements, typically spacing between two SiP level-requirements, of a specific structure.

Figure 11:
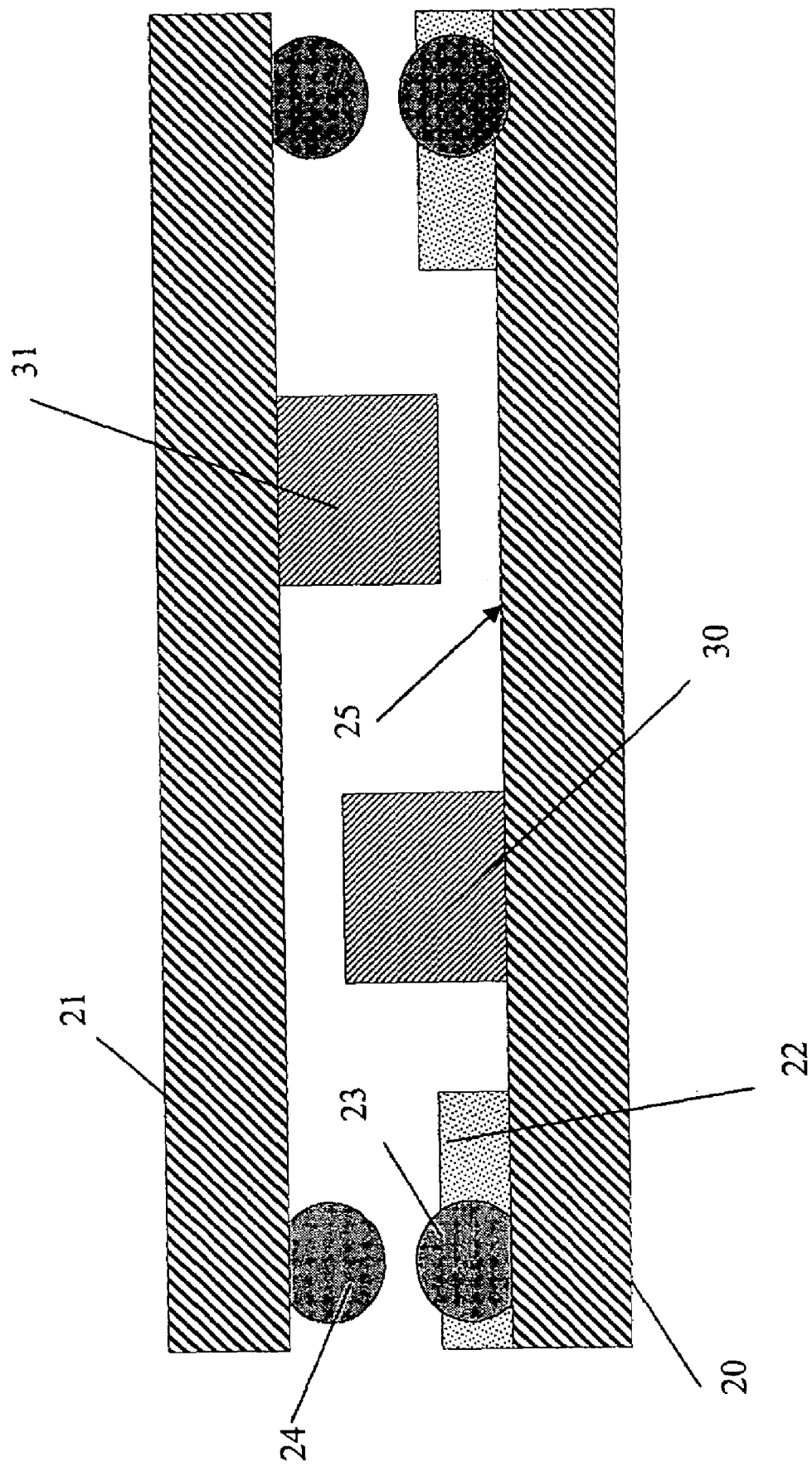
FIG. 11 is a diagram showing an embodiment having exclusion areas and offset components.

FIGS. 11 to 14 illustrate embedding layers of non-conductive material, and provided with exclusion areas. FIG. 11 shows the assembly of a first substrate 20 and a second substrate 21, where an embedding layer 22 is present on the first substrate. The layer 22 embeds the solder balls 23 on the first substrate up to a level below the height of the embedded solder balls. The second substrate carries solder balls 24 but no embedding layer. The embedding layer 22 is provided with an exclusion area 25, which is an open space on the first substrate's main surface, on which no non-conductive material is present. The first and second substrate have components 30 and 31 on their surface respectively, which are higher than the solder balls on the respective surfaces on which they are present. The components are positioned thus that they do not touch each other during assembly of the device. In particular, component 31 on the second substrate is facing the exclusion area on the first substrate during bonding, so that bonding can take place without the component 31 touching the lower substrate.

Figure 12:
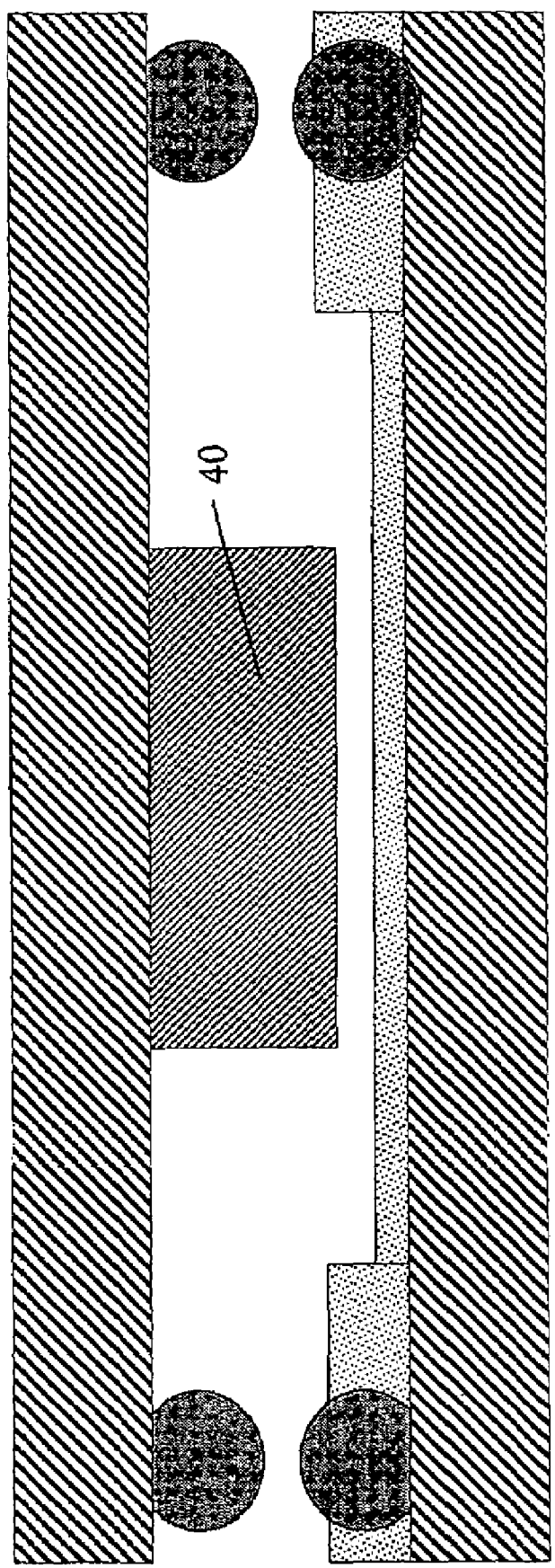
FIG. 12 is a diagram showing an embodiment having recesses.
Figure 13A:
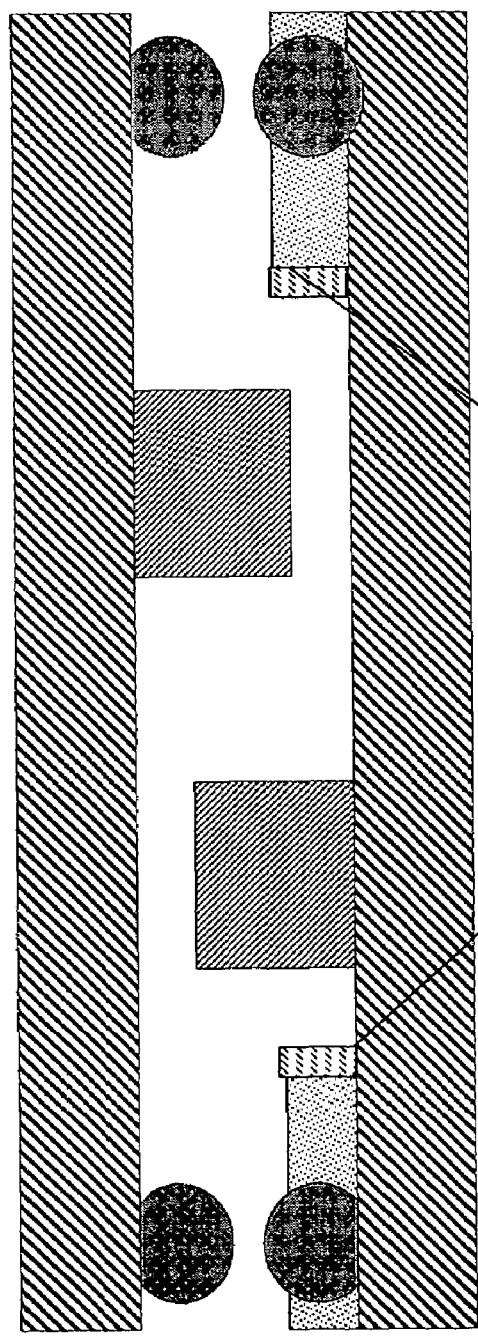
FIGS. 13a and 13b are a diagram showing an embodiment having exclusion areas and confinement structures corresponding to the exclusion areas.

FIG. 12 shows an exclusion area which is provided for the same purpose, namely to avoid contact between a component 40 and the lower substrate. In this case, however, the exclusion area is not free of non-conductive material, but provided with a layer of such material, which is lower in thickness than on the remainder of the surface.

Figure 13B:
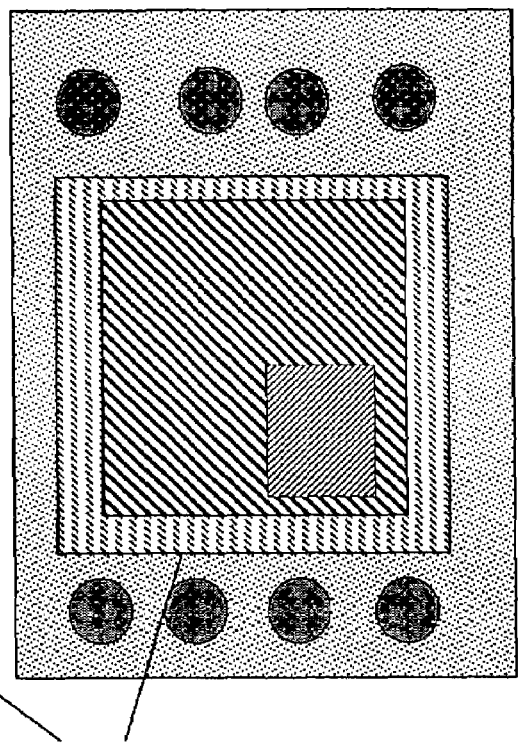
Figure 14:
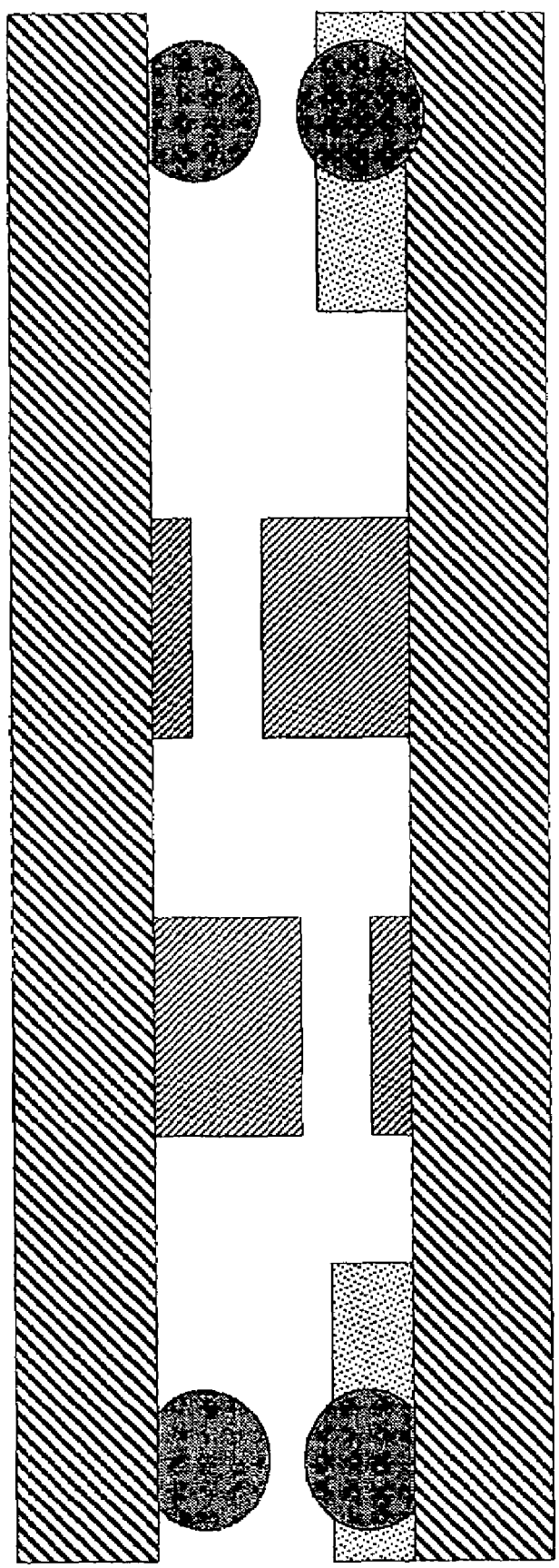
FIG. 14 is a diagram showing an embodiment having exclusion areas with varying height components.

FIG. 13 shows the possibility of providing a reinforcement structure 6 along the border of the exclusion area, to reinforce the non-conductive material around the area, and retain the material outside the exclusion area. FIG. 14 shows another embodiment, where both substrates carry components, arranged on the exclusion area.

Figure 15A:
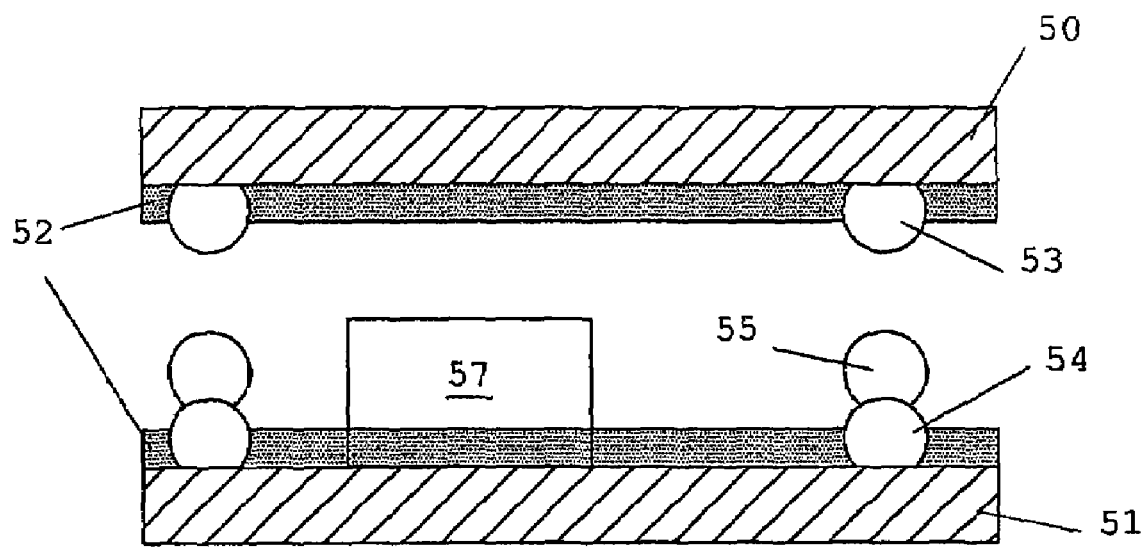
FIG. 15 is a diagram showing an embodiment of the method and device involving a solder structure with three solder balls.
Figure 15B:
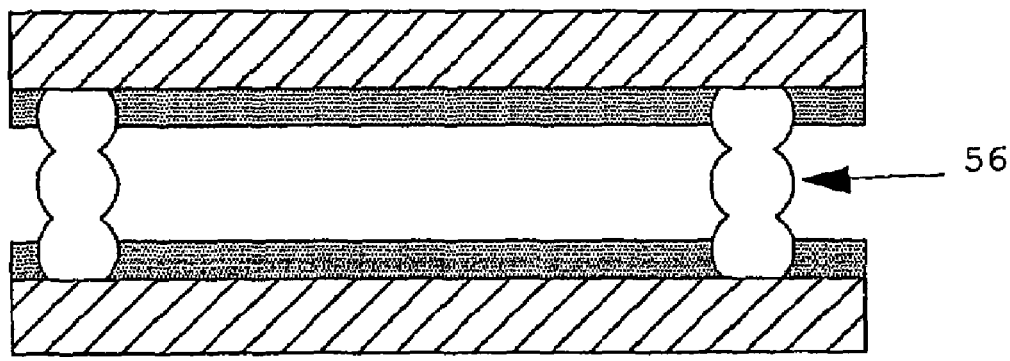

FIG. 15 shows another embodiment, wherein a third solder volume, here a solder ball, is applied between the two solder balls applied directly to the main surfaces. In this embodiment of the method, a first solder ball 54 is produced on the main surface of the first element (lower substrate) 51, a second solder ball 53 is produced on the main surface of the second element (upper substrate) 50, and both solder balls are embedded in a layer 52 of non-conductive material which is parallel to the respective main surfaces. A third solder ball 55 is then produced on the solder ball 54 on the lower substrate, and the upper substrate is bonded to the lower substrate, so that the contact between the solder balls 53, 54 arranged on the respective surfaces, is made through the third solder ball 55. The final bonding structure is a stack 56 of three solder balls, of approximately equal diameter. The production of the third solder ball is done by the same methods as are used for the other two solder balls. The bonding step and possibly subsequent underfill application steps are performed according to the same methods as described above for the two-solder ball embodiments. This embodiment equally allows several elements to be bonded together in a package, by repeated application of the three-solder ball method, or by use of the three solder ball method in combination with the above-described two-solder ball method. This three-ball embodiment allows larger distances between the bonded substrates, which may be necessary when high components (e.g., component 57 in FIG. 15) are present on one or both of the substrates. A device comprises a bonding structure comprising a stack 56 of three solder balls, the upper and lower solder balls being embedded by a layer of non-conductive material.

I claim:

1. A method for bonding elements, the method comprising:
   producing on a main surface of a first element a first solder ball;
   producing on a main surface of a second element a second solder ball;
   providing contact between the first solder ball and the second solder ball;
   bonding the first element and the second element by applying a reflow act whereby the solder balls melt and form a joined solder ball structure;
   wherein
   prior to the bonding, the first solder ball is laterally embedded in a first layer of non-conductive material, such that the upper part of the first solder ball is not covered by the non-conductive material; and
   prior to the bonding, the second solder ball is laterally embedded in a second layer of non-conductive material, such that the upper part of the second solder ball is not covered by the non-conductive material, further comprising applying a third solder volume on one or both of the embedded first or second solder balls, prior to the bonding.

2. The method according to claim 1, wherein the first layer of non-conductive material laterally embeds the first solder ball at a level parallel to the main surface of the first element.

3. The method according to claim 1, wherein the second layer of non-conductive material laterally embeds the second solder ball at a level parallel to the main surface of the second element.

4. The method according to claim 1, wherein the first layer of non-conductive material laterally embeds the first solder ball at a level parallel to the main surface of the first element and wherein the second layer of non-conductive material laterally embeds the second solder ball at a level parallel to the main surface of the second element.

5. The method according to claim 4, wherein the height of the parallel layers on the main surfaces of the first or second element is at least 50% of the height of the respective solder balls on the main surfaces.

6. The method according to claim 4, wherein the height of the parallel layers on the main surface of the first or second element is at least 60% of the height of the respective solder balls on the main surfaces.

7. The method according to claim 4, wherein the height of the parallel layers on the main surface of the first or second element is at least 70% of the height of the respective solder balls on the main surfaces.

8. The method according to claim 4, wherein the height of the parallel layers on the main surface of the first or second element is at least 80% of the height of the respective solder balls on the main surfaces.

9. The method according to claim 4, wherein the height of the parallel layers on the main surface of the first or second element is at least 90% of the height of the respective solder balls on the main surfaces.

10. The method according claim 1, wherein the main surface of the first and/or the second element comprises one or more components or structures extending outwards from the respective main surfaces, and wherein the height of the component(s) or structure(s) present on a main surface is smaller than the height of the solder ball present on the main surface on which the component(s) or structure(s) are present.

11. The method according to claim 1, wherein the height of at least one of component(s) or structure(s) present on the main surface of the first and/or the second element is smaller then the height of the joined solder ball structure but larger than the solder ball on the respective main surface on which the component(s) or structure(s) is present.

12. The method according to claim 1, wherein one of the first or second layers of non-conductive material is applied on the respective main surface on which one or more components or structures are present.

13. The method according to claim 12, wherein the height of the one of the first or second layers is larger than the maximum height of the components or structures.

14. The method according to claim 1, wherein at least one of the first or second layers of non-conductive material is provided with an exclusion area, wherein no non-conductive material is present in the exclusion area, or wherein in the exclusion area a non-conductive layer is present with a lower thickness than on the remainder of the main surface on which the non-conductive layer is applied.

15. The method according to claim 14, wherein on one of the main surfaces, an exclusion area is provided, and wherein on the other main surface, at least one component is present whereof the height is larger than the height of the solder ball on the other surface, and wherein the component faces the exclusion area when the elements are bonded together so that due to the exclusion area, the component does not touch the opposite element.

16. The method according to claim 14, wherein the main surface comprising the exclusion area further comprises a confinement structure providing an enclosure to the exclusion area.

17. The method according to claim 1, further comprising applying an underfill/overmold operation, which fills up the remaining gaps between the elements.

18. A method for producing stacked structures, wherein the method according to claim 1 is applied an integer number of times, by repetitively bonding a main surface of an element, bonded before by the method according to claim 1, to a main surface of a further element.

19. The method according to claim 18, wherein applying an underfill/overmold operation is applied only once for the whole stacked structure.

20. The method according to claim 18, wherein the same solder reflow act is applied for bonding all elements in a stacked structure.

21. The method according to claim 1, wherein the elements are substrates, chips or dies.

22. The method according to claim 1, wherein the third solder volume is applied in the form of a third solder ball.

* * * * *

UNITED STATES PATENT AND TRADEMARK OFFICE
CERTIFICATE OF CORRECTION

PATENT NO. : 7,378,297 B2  
APPLICATION NO. : 11/441794  
DATED : May 27, 2008  
INVENTOR(S) : Eric Beyne Page 1 of 1

It is certified that error appears in the above-identified patent and that said Letters Patent is hereby corrected as shown below:

| Column | Line | Description of Error |
|---|---|---|
| 7 | 5 | Delete "then" and insert -- than --, therefor. |
| 7 | 9 | Delete "then" and insert -- than --, therefor. |
| 7 | 18 | Delete "then" and insert -- than --, therefor. |
| 7 | 23 | Delete "FIG. 13a, b" and insert -- FIGS. 13a, b --, therefor. |
| 7 | 51 | Delete "then" and insert -- than -- therefor. |
| 8 | 19 | Delete "then" and insert -- than --, therefor. |
| 8 | 20 | Delete "then" and insert -- than --, therefor. |
| 8 | 26 (Approx.) | Delete "then" and insert -- than --, therefor. |
| 12 | 5 | In Claim 10, after "according" insert -- to --. |
| 12 | 16 (Approx.) | In Claim 11, delete "then" and insert -- than --, therefor. |

Signed and Sealed this

Twenty-second Day of December, 2009

David J. Kappos  
*Director of the United States Patent and Trademark Office*